US 012068050B2

(12) United States Patent
Rovelli et al.

(10) Patent No.: US 12,068,050 B2
(45) Date of Patent: Aug. 20, 2024

(54) GLITCH DETECTION REDUNDANCY

(71) Applicant: Micron Technology, Inc., Boise, ID (US)

(72) Inventors: Angelo Alberto Rovelli, Agrate Brianza (IT); Craig A. Jones, Plano, TX (US)

(73) Assignee: Micron Technology, Inc., Boise, ID (US)

(*) Notice: Subject to any disclaimer, the term of this patent is extended or adjusted under 35 U.S.C. 154(b) by 59 days.

(21) Appl. No.: 17/831,329

(22) Filed: Jun. 2, 2022

(65) Prior Publication Data
US 2023/0395181 A1 Dec. 7, 2023

(51) Int. Cl.
*G11C 29/00* (2006.01)
*G11C 29/02* (2006.01)
*G11C 29/52* (2006.01)

(52) U.S. Cl.
CPC ............ *G11C 29/52* (2013.01); *G11C 29/021* (2013.01); *G11C 29/023* (2013.01)

(58) Field of Classification Search
CPC ......... G11C 29/52; G11C 29/00; G11C 29/02; G11C 29/12; G11C 29/38; G11C 29/44; G11C 29/10; G11C 7/10; G11C 7/20; G11C 7/22; G11C 11/406; G11C 11/412; G11C 11/56; G11C 13/00; G11C 16/08; G11C 16/10; G11C 16/26; G11C 16/32; G11C 16/34; G11C 29/04; G11C 29/42; G11C 5/00; G11C 7/02
USPC .......................................... 365/136, 201, 222
See application file for complete search history.

(56) References Cited

U.S. PATENT DOCUMENTS

| | | | | |
|---|---|---|---|---|
| 4,545,013 A | * | 10/1985 | Lyon ....................... | H04L 43/50 714/712 |
| 2007/0058452 A1 | | 3/2007 | Kim et al. | |
| 2014/0140159 A1 | | 5/2014 | Fishleigh | |

OTHER PUBLICATIONS

Jakub Breier, et al., "An Electromagnetic Fault Injection Sensor using Hogge Phase-Detector", 2017, 18th International Symposium on Quality Electronic Design (ISQED), 7 pages.

* cited by examiner

*Primary Examiner* — Thong Q Le
(74) *Attorney, Agent, or Firm* — Brooks, Cameron & Huebsch, PLLC

(57) ABSTRACT

A method can include detecting, by a glitch detector coupled via a connection matrix to a first processing unit, an indication of a glitch on a memory system. The method can include notifying, via the connection matrix, at least a second processing unit of the detected indication of the glitch. The method can include subsequent to notifying at least the second processing unit, transmitting via the at least the second processing unit a glitch confirmation signal.

20 Claims, 6 Drawing Sheets

GLITCH DETECTION REDUNDANCY

TECHNICAL FIELD

Embodiments of the disclosure relate generally to memory systems, and more specifically, relate to glitch detection redundancy.

BACKGROUND

A memory system can include one or more memory devices that store data. The memory devices can be, for example, non-volatile memory devices and volatile memory devices. In general, a host can utilize a memory system to store and retrieve data at the memory devices.

BRIEF DESCRIPTION OF THE DRAWINGS

The disclosure will be understood more fully from the detailed description given below and from the accompanying drawings of various embodiments of the disclosure.

DETAILED DESCRIPTION

Figure 1:
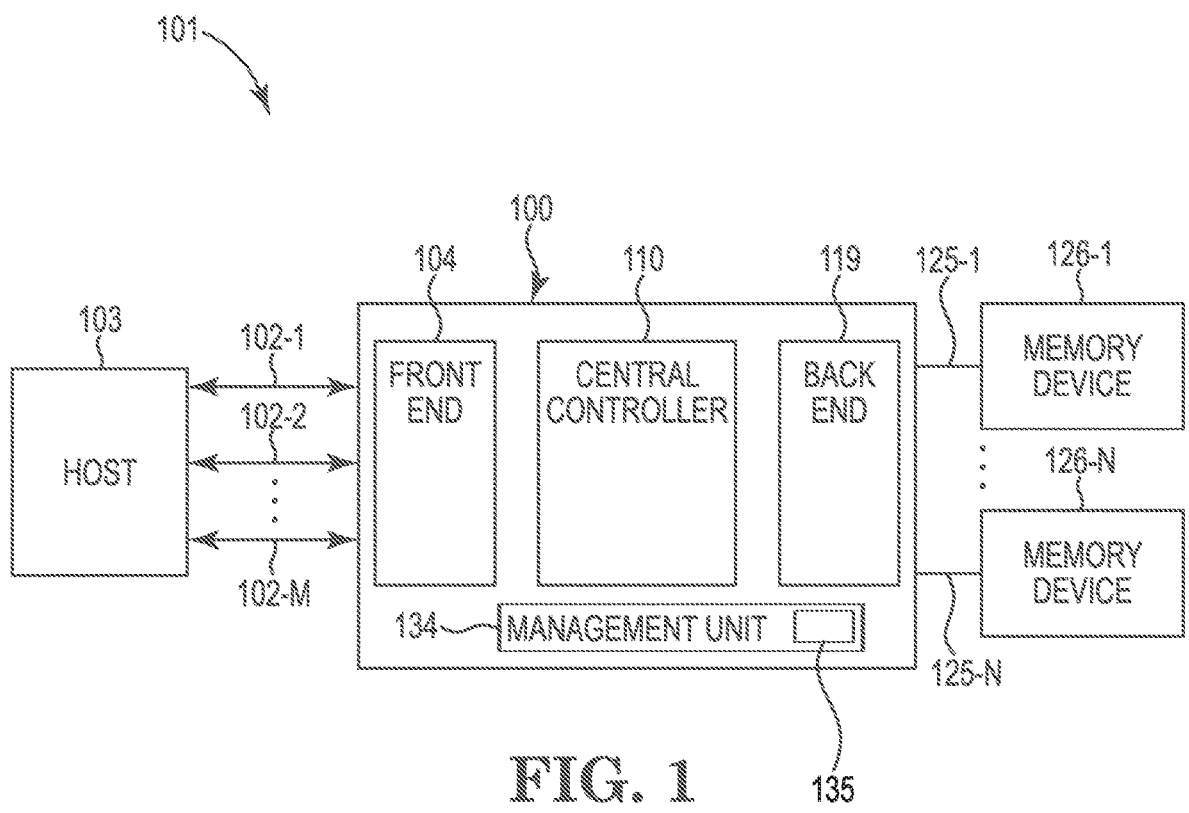
FIG. 1 is a functional block diagram of a computing system including a memory controller in accordance with a number of embodiments of the disclosure.

Memory controllers for glitch detection redundancy are described. The memory controllers can be included in an apparatus such as a memory system. A memory system can be a storage system, storage device, a memory module, or a combination of such. An example of a memory system is a storage system such as a solid-state drive (SSD).

In some embodiments, the memory system can be a non-deterministic memory protocol compliant memory system such as a compute express link (CXL) compliant memory system. For instance, a host interface can be managed with CXL protocols and be coupled to a host via an interface configured for a peripheral component interconnect express (PCIe) protocol. CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall memory system cost. CXL is designed to be an industry open standard interface for high-speed communications, as accelerators are increasingly used to complement CPUs in support of emerging applications such as artificial intelligence and machine learning. CXL technology is built on the PCIe infrastructure, leveraging PCIe physical and electrical interfaces to provide advanced protocol in areas such as input/output (I/O) protocol, memory protocol (e.g., initially allowing a host to share memory with an accelerator), and coherency interface.

Protecting data on memory system from any unintended or nefarious use is desired in various instances. For instance, it may be desirable to protect data on a memory system during an operational lifetime of the memory system.

A glitch attack can be used against a memory system. A glitch attack refers to an attack directed, for instance, at a side-channel (e.g., a voltage supply/ground, clock, etc.) and which can be used to inject or otherwise cause a fault in a memory system. For instance, glitch attacks can seek to bypass or otherwise subvert security checks in a CPU sub-system, such as those described herein. For instance, a glitch attack can be employed by intentionally imparting a change in voltage (e.g., a positive voltage change, or negative voltage change from an intended operational voltage) of a memory system having a duration and/or a magnitude sufficient to impact operation of the memory system. For instance, a nefarious entity can employ a glitch attack to alter data on a memory system and/or to gain access to a memory system that would not otherwise be accessible to the nefarious entity. Moreover, along an operational lifetime a memory system can experience glitches due to a change in a supply voltage or other type of intermittent change in an environmental/internal factor that can impact the memory system.

As such, some approaches may employ a combination of detection and response in an attempt to mitigate any impact of a glitch such as a glitch from a glitch attack. In this way, a memory system can detect a glitch attack and respond with actions to mitigate/recover from the glitch attack. For instance, a glitch detector can detect a glitch attack. As detailed herein, a glitch detector refers to a device that can detect an indication of a glitch attack such as a change in a voltage and/or a change in a clock signal and thereby detect a glitch attack. Responsive to detection of a glitch attack the glitch detector can, via a processing unit coupled to the glitch detector, trigger an alarm so the memory system can respond to the glitch attack and thereby mitigate any impact of the glitch attack.

However, a glitch detector which detects a glitch attack may be proximate to a source of the glitch attack. Similarly, a processing unit coupled to the glitch detector may be proximate to the source of a glitch such as a glitch resultant from a glitch attack. As such, the processing unit may be prone to impact and/or damage from the glitch attack. Once impacted and/or damaged by the glitch attack, the processing unit may not function as intended. For instance, signaling indicative of a glitch attack may not be received by and/or may not be transmitted by the processing unit. Consequently, even if the glitch attack is initially detected by the glitch detector, an alarm may not be triggered. In the absence of triggering the alarm, the memory system as a whole may not be aware of the occurrence of the glitch attack and thus may not respond with procedures to mitigate the glitch attack.

Aspects of the disclosure address the above and other deficiencies by implementing glitch detection redundancy, as detailed herein. Notably, glitch detection redundancy can notify at least a one remote processing unit (e.g., a second processing unit) of an indication of glitch detected by a local glitch detector (e.g., local with respect to a first processing unit). That is, glitch detection redundancy as detailed herein provides redundant signaling (e.g., redundant interrupt signals) and/or a redundant indication (e.g., two of more status bits indicating the presence of a glitch) as a glitch confirmation signal that is propagated by a second glitch detector such as a glitch detector that is remote to the first glitch detector. Propagation of the glitch confirmation signal by the remote glitch detector can ensure that a glitch alarm is triggered, a glitch mitigation operation is performed, or both. Thus, even if a glitch such as glitch from a glitch attack damages a processing unit (e.g., the first processing unit), the remote processing unit can still transmit signaling to other components so an alarm can be triggered and/or glitch mitigation operations can be performed. While described above as relating to operation of a glitch detector and providing glitch detection redundancy, the methodologies herein can be applied to various other types of detectors.

As used herein, a "processing unit" refers to electronic circuitry that executes or runs instructions. Examples of processing units include central processing units, graphics processing units, or both, among other types of processing units.

As used herein, a "local glitch detector" refers to a glitch detector that is physically adjacent to a given processing unit. Each processing unit can have an individual corresponding local glitch detector (e.g., an individual local glitch detector including a local voltage glitch detector and/or a local electromagnetic glitch detector, as detailed herein). A local glitch detector and processing unit that is physically adjacent thereto can be part of the same component, as detailed herein.

As used herein, a "remote glitch detector" refers to a glitch detector that is not physically adjacent to a given processing unit. For instance, glitch detectors may not be physically adjacent to a processing unit if the glitch detectors and the processing unit are present in different components, as detailed herein.

As used herein, a "connection matrix" refers to combination of traces, interconnects, and/or other circuitry coupling glitch detectors to processing units. For example, the connection matrix can couple each individual glitch detector included in a memory system to at least two processing units, in contrast to other approaches that have an individual glitch detector coupled to an individual processing unit. Notably, the connection matrix can permit "redundant" signaling to be provided to a plurality of processing units responsive to detection of an indication of a glitch such as a glitch from a glitch attack by an individual glitch detector. Thus, at least two processing units can be notified responsive to detection of an indication of the glitch. For instance, each processing unit can be notified responsive to detection of an indication of a glitch. As such, even if a glitch such a glitch from a glitch attack damages some but not all of the processing units any of the undamaged/functional processing units can transmit signaling indicative of the detected attack to other components so an alarm can be triggered and/or glitch mitigation operation can be performed.

The glitch detectors can be included in the same or different physical portions (e.g., a central portion, back-end portion, etc.) of a memory controller. For instance, a first glitch detector can be included in the central portion (e.g., in a central controller) and a second glitch detector can be included in a different portion such as the back-end portion (e.g., in a channel controller/bank controller). However, in some embodiments, the glitch detectors can be included in the same portion (e.g., in a central portion or in a back-end portion) of a memory controller.

In any case, glitch detection redundancy, as detailed herein, can permit enhanced glitch detection as compared to other approaches that rely on transmission of a glitch alert signal to an individual component (e.g., an individual processing unit). For instance, the accuracy, speed, and/or a reduction in any quantity of false negative can be enhanced as compared to other approaches such as those the rely on transmission of a glitch alert signal to an individual component (e.g., processing unit).

Interfaces such as peripheral component interconnect express (PCIe), compute express link (CXL), cache coherent interconnect for accelerators (CCIX), etc. allow connecting a variety of memory devices to a host. The combination of interfaces and memory technology improvements can allow for deploying "far memory", which can consist of system memory (e.g., memory devices) being implemented behind a front-end of a memory system such as PCIe, CXL, CCIX, GenZ., etc. As used herein, the front-end of the memory system can also be referred to as an interface of the memory system or as a front-end of a controller of the memory system. As used herein, the front-end of the memory system can comprise hardware and/or firmware configured to receive data (e.g., requests and/or data) and provide the data to a back-end of the memory system. The back-end of the memory system can comprise hardware and/or firmware to receive the data (e.g., requests and/or data) from the front-end of the memory system and can include perform the requests provided from the host on the memory devices of the memory system.

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected. It is to be understood that data can be transmitted, received, or exchanged by electronic signals (e.g., current, voltage, etc.) and that the phrase "signal indicative of [data]" represents the data itself being transmitted, received, or exchanged in a physical medium. The signal can correspond to a command (e.g., a read command, a write command, etc.).

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. Analogous elements within a Figure may be referenced with a hyphen and extra numeral or letter. See, for example, elements 102-1, 102-2, 102-M in FIG. 1. Such analogous elements may be generally referenced without the hyphen and extra numeral or letter. For example, elements 102-1, 102-2, 102-M may be collectively referenced as 102. As used herein, the designators "M" and "N", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the disclosure. In addition, as will be appreciated, the proportion and the relative scale of the elements provided in the figures are intended to illustrate certain embodiments of the disclosure and should not be taken in a limiting sense.

FIG. 1 is a functional block diagram of a computing system 101 including a memory controller 100 in accordance with a number of embodiments of the disclosure. The memory controller 100 can include a front end portion 104, a central controller portion 110, and a back-end portion 119. The computing system 101 can include a host 103 and memory devices 126-1, . . . , 126-N coupled to the memory controller 100. The memory controller 100 which is coupled to the host 103 can be discrete from the one or more of the memory devices 126-1, . . . , 126-N.

The front end portion 104 includes an interface and interface management circuitry to couple the memory controller 100 to the host 103 through input/output (I/O) lanes 102-1, 102-2, . . . , 102-M and circuitry to manage the I/O lanes 102. There can be any quantity of I/O lanes 102, such as eight, sixteen, or another quantity of I/O lanes 102. In some embodiments, the I/O lanes 102 can be configured as a single port. In at least one embodiment, the interface between the memory controller 100 and the host 103 can be a PCIe physical and electrical interface operated according to non-deterministic protocol such as a CXL protocol.

The central controller portion 110 can include and/or be referred to as data management circuitry. The central controller portion 110 can control, in response to receiving a request from the host 103, performance of a memory operation. Examples of the memory operation include memory access request such as a read operation to read data from a memory device 126 or a write operation to write data to the memory device 126.

The central controller portion 110 can generate error detection information and/or error correction information based on data received from the host 103. The central controller portion 110 can perform error detection operations and/or error correction operations on data received from the host 103 or from the memory devices 126. An example of an error detection operation is a cyclic redundancy check (CRC) operation. An example of an error correction operation is an error correction code (ECC) operation.

The back end portion 119 can include a media controller and a physical (PHY) layer that couples the memory controller 100 to the memory devices 126. As used herein, the term "PHY layer" generally refers to the physical layer in the Open Systems Interconnection (OSI) model of a computing system. The PHY layer may be the first (e.g., lowest) layer of the OSI model and can be used transfer data over a physical data transmission medium. In some embodiments, the physical data transmission medium can include channels 125-1, . . . , 125-N. The channels 125 can include a sixteen pin data bus and a two pin data mask inversion (DMI) bus, among other possible buses. The back end portion 119 can exchange (e.g., transmit or receive) data with the memory devices 126 via the data pins and exchange error detection information, RAID information, and/or error correction information with the memory devices 126 via the DMI pins. Error detection information and/or error correction information can be exchanged contemporaneously with the exchange of data.

An example of the memory devices 126 is dynamic random access memory (DRAM) operated according to a protocol such as low-power double data rate (LPDDRx), which may be referred to herein as LPDDRx DRAM devices, LPDDRx memory, etc. The "x" in LPDDRx refers to any of a number of generations of the protocol (e.g., LPDDR5).

In some embodiments, the memory controller 100 can include a management unit 134 to initialize, configure, and/or monitor characteristics of the memory controller 100. The management unit 134 can include an I/O bus to manage out-of-band data and/or commands, a management unit controller to execute instructions associated with initializing, configuring, and/or monitoring the characteristics of the memory controller, and a management unit memory to store data associated with initializing, configuring, and/or monitoring the characteristics of the memory controller 100. As used herein, the term "out-of-band" generally refers to a transmission medium that is different from a primary transmission medium of a network. For example, out-of-band data and/or commands can be data and/or commands transferred to a network using a different transmission medium than the transmission medium used to transfer data within the network.

The memory controller 100 can include a connection matrix 135 to couple glitch detectors to processing units, as detailed herein. While illustrated as being located in the management portion 134 some or all of the connection matrix 135 can be located in a different portion of the memory controller 100. For instance, interrupt lines or status registers of the connection matrix 135 can be included in the central controller portion 110 or in the back-end portion 119, among other possibilities.

Figure 2:
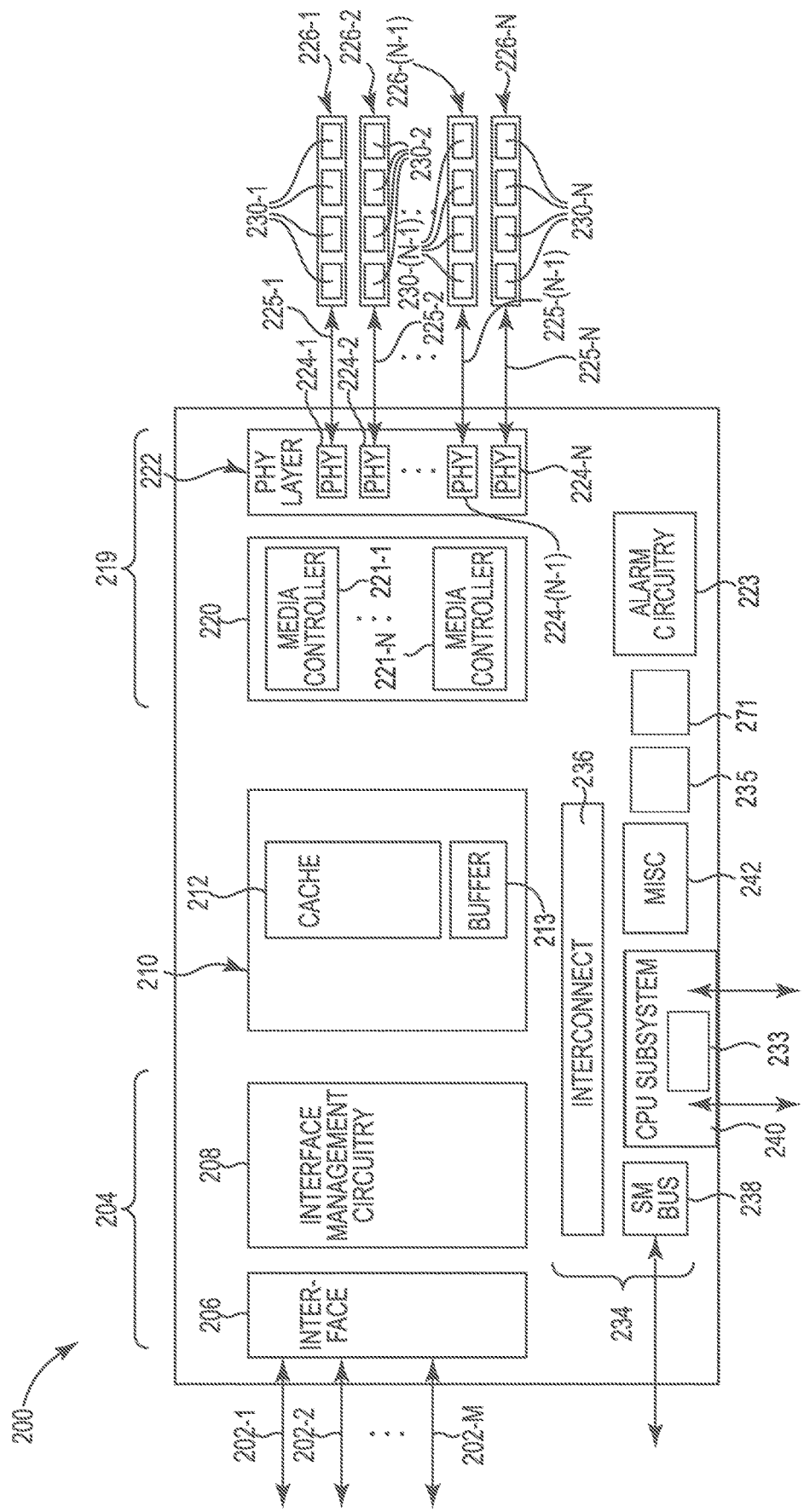
FIG. 2 is a functional block diagram of a memory controller in accordance with a number of embodiments of the disclosure.

FIG. 2 is a functional block diagram of a memory controller 200 in accordance with a number of embodiments of the disclosure. As shown in FIG. 2, a front end portion 204 can include an interface 206, which includes multiple I/O lanes 202-1, 202-2, . . . , 202-M, as well as interface management circuitry 208 to manage the interface 206. An example of the interface 206 is a peripheral component interconnect express (PCIe) 5.0 interface. In some embodiments, the memory controller 200 can receive access requests involving at least one of the cache memory 212 and the memory devices (e.g., die) 226-1, 226-2, . . . , 226-(N-1), 226-N via the interface 206 according to a non-deterministic memory protocol such as a CXL protocol. The interface 206 can receive data from a host (e.g., the host 103 shown in FIG. 1) through the I/O lanes 202. The interface management circuitry 208 may use a non-deterministic protocol such as CXL protocols to manage the interface 206 and may be referred to as CXL interface management circuitry 208. The CXL interface management circuitry 208 can be coupled to a host via the PCIe interface 206.

Central controller portion 210 (also referred to herein as data management circuitry 210) can be coupled to the interface management circuitry 208. The data management circuitry 210 can be configured to cause performance of a memory operation. The data management circuitry 210 can include error detection circuitry (e.g., "CRC circuitry") and error correction circuitry, among other possible circuitry such as RAID circuitry and/or low-power chip kill circuitry.

The data management circuitry 210 can include a cache memory (cache) 212 to store data, error detection information, error correction information, and/or metadata associated with performance of the memory operation. An example of the cache memory 212 is a thirty two (32) way set-associative cache memory including multiple cache lines. The cache line size can be equal to or greater than the memory controller 200 access granularity (e.g., 64 bytes for a CXL protocol). For example, each cache line can include 256 bytes of data. In another example, each cache line can include 512 bytes of data. Read and write requests of CXL memory systems can be 64 bytes in size. Therefore, data entries in the cache memory 212 can have 64 bytes of data.

Each cache line can comprise 256 bytes. Therefore, multiple 64 byte requests can be stored in each cache line. In response to a request from the host, the memory controller 200 can write 256 bytes of data to a memory device 226. In some embodiments, the 256 bytes of data can be written in 64 byte chunks. Use of the cache memory 212 to store data associated with a read operation or a write operation can increase a speed and/or efficiency of accessing the data because the cache memory 212 can prefetch the data and store the data in multiple 64 byte blocks in the case of a cache miss. Instead of searching a separate memory device, the data can be read from the cache memory 212. Less time and energy may be used accessing the prefetched data than would be used if the memory system has to search for the data before accessing the data.

The data management circuitry 210 can include a buffer 213 to store data, error detection information, error correction information, and/or metadata subject to an operation thereon by another component of the data management circuitry 210. The buffer 213 can allow for the temporary storage of information, for example, while another component of the data management circuitry 210 is busy. In some embodiments, the cache memory 212 can be used to temporarily store data and the buffer 213 can be used to temporarily store other information associated with the data, such as error detection information, error correction information, and/or metadata.

As shown in FIG. 2, the memory controller 200 can include a back end portion 219 including a media control circuitry 220 coupled to the data management circuitry 210. The media control circuitry 220 can include media controllers 221-1, . . . , 221-N.

Figure 3:
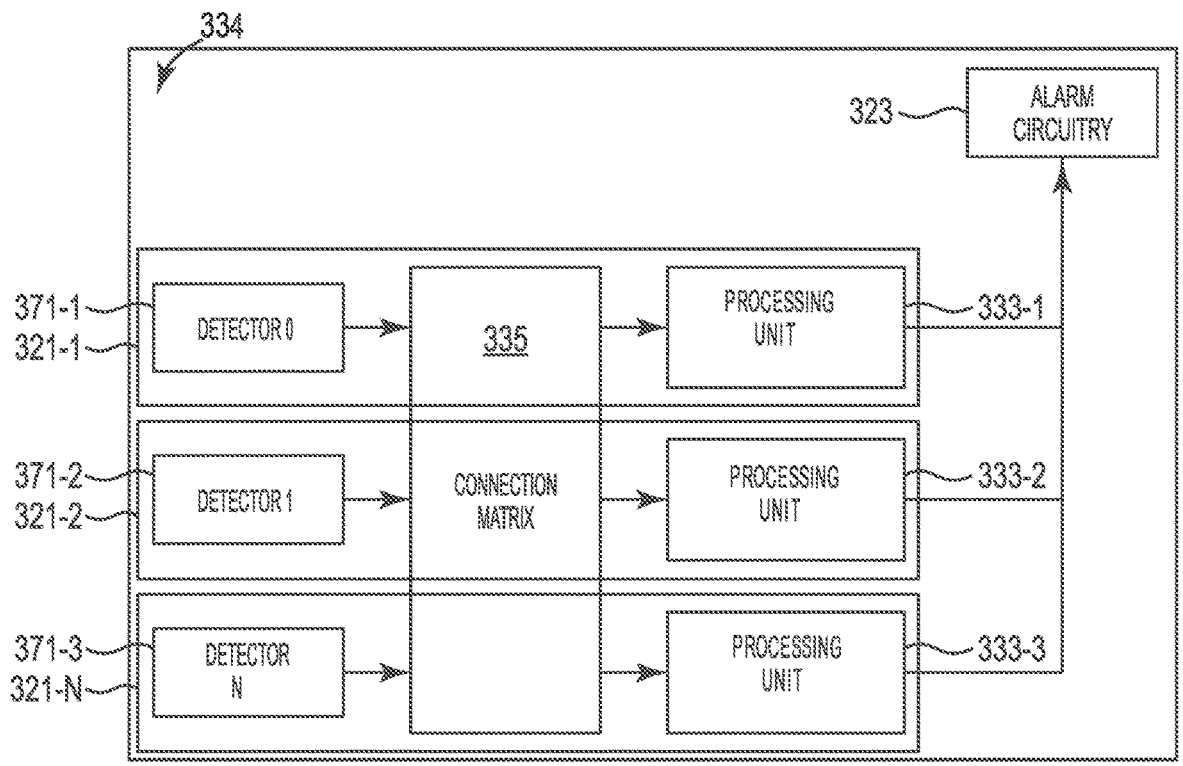
FIG. 3 is a functional block diagram of a management portion of a memory controller in accordance with a number of embodiments of the disclosure.
Figure 4A:
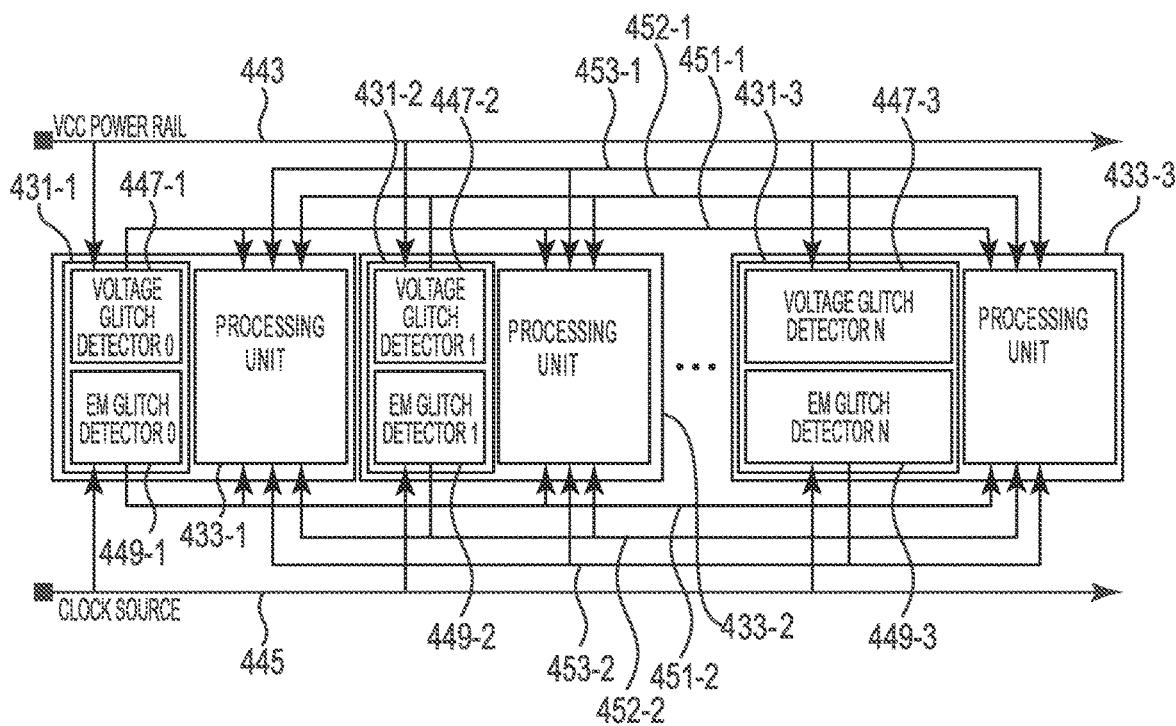
FIG. 4A is another functional block diagram of a management portion of a memory controller having a first configuration in accordance with a number of embodiments of the disclosure.
Figure 4B:
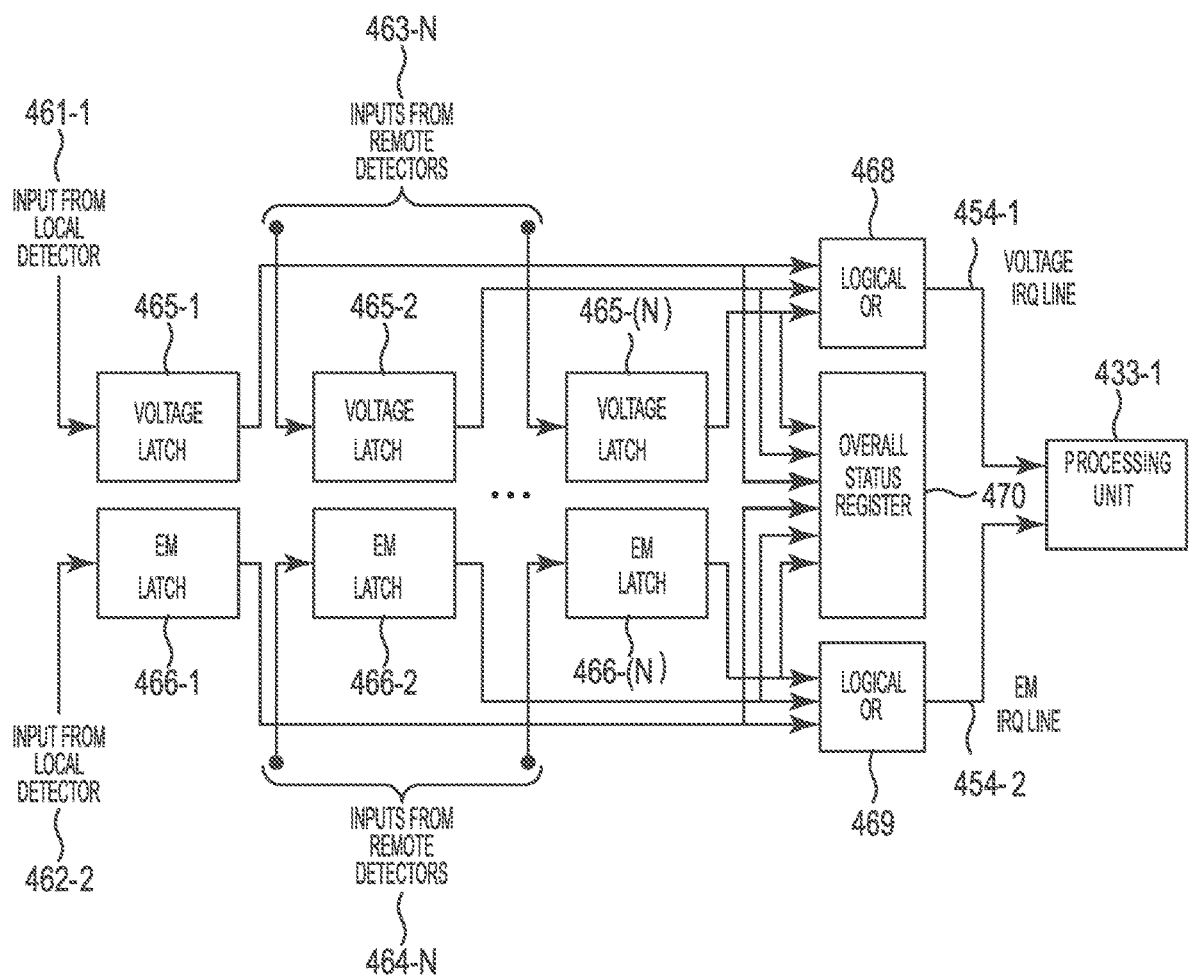
FIG. 4B is a functional block diagram of a management portion of a memory controller having a second configuration in accordance with a number of embodiments of the disclosure.

For instance, each media controller 221-1 can include a glitch detector 271 and a processing unit 233, as detailed in FIG. 3, FIG. 4A, and FIG. 4B. While illustrated as particular locations in FIG. 2, in some embodiments the glitch detector 271 and/or the processing unit 233 can be located elsewhere in the memory controller 200.

The back end portion 219 can include a physical (PHY) layer 222 having PHY memory interfaces 224-1, 224-2, . . . , 224-(N-1), 224-N. Each physical interface 224 is configured to be coupled to a respective memory device 226. The PHY layer 222 can be a memory interface to configured for a deterministic memory protocol such as a LPDDRx memory interface or other DDR type of memory interface.

The back end portion 219 can couple the PHY layer portion 222 to memory banks 230-1, 230-2, . . . , 230-(N-1), 230-N of memory devices 226-1, 226-2, . . . , 226-(N-1), 226-N. The memory devices 226 each include at least one array of memory cells. In some embodiments, the memory devices 226 can be different types of memory. The media control circuitry 220 can be configured to control at least two different types of memory. For example, the memory devices 226-1, 226-2 can be DDR type memory such as a LPDDRx memory operated according to a first protocol and the memory devices 226-(N-1), 226-N can be a DDR type memory such as a LPDDRx memory operated according to a second protocol different from the first protocol. In such an example, the first media controller 221-1 can be configured to control a first subset of the memory devices 226-1, 226-2 according to the first protocol and the second media controller 221-N can be configured to control a second subset of the memory devices 226-(N-1), 226-N according to the second protocol. In a specific example, the memory devices 226-1, 226-2 may have on board error correction circuitry.

The memory controller 200 can include a management unit 234 configured to initialize, configure, and/or monitor characteristics of the memory controller 200. In some embodiments, the management unit 234 includes a system management (SM) bus 238. The SM bus 238 can manage out-of-band data and/or commands. The SM bus 238 can be part of a serial presence detect. In some embodiments, the SM bus 238 can be a single-ended simple two-wire bus for the purpose of lightweight communication. The management unit 234 can include a CPU subsystem 240, which can function as a controller for the management unit to execute instructions associated with initializing, configuring, and/or monitoring the characteristics of the memory controller 200. As illustrated in FIG. 2, the CPU subsystem 204 can include a processing unit 233, such as those processing units detailed herein with respect to FIG. 3, FIG. 4A, and/or FIG. 4B. The management unit 234 can include miscellaneous circuitry 242, such as local memory to store codes and/or data associated with managing and/or monitoring the characteristics of the memory controller 200. An endpoint of the management unit 234 can be exposed to the host system (e.g., the host 103 shown in FIG. 1) to manage data. In some embodiments, the characteristics monitored by the management unit 234 can include a voltage supplied to the memory controller 200 and/or a temperature measured by an external sensor. The management unit 234 can include an interconnect 236, such as an advanced high-performance bus (AHB) to couple different components of the management unit 234.

As illustrated in FIG. 2, the management unit 234 can include alarm circuitry 223. Alarm circuitry 223 can be configured to transmit a system-wide glitch alarm to a plurality of components of the memory controller 200 and/or other components of the computing system (e.g., computing system 101 as described in FIG. 1). For instance, the alarm circuitry 223 can transmit signaling indicative of an alarm and/or signaling to cause initiation of an alarm to the central controller and/or to a host, among other possibilities.

The management unit 234 can include circuitry to manage in-band data (e.g., data that is transferred through the main transmission medium within a network, such as a local area network (LAN)). In some embodiments, the CPU subsystem 240 can be a controller that meets the Joint Test Action Group (JTAG) standard and operate according to an Inter-Integrate Circuit (I$^2$C or I$^3$C) protocol, and auxiliary I/O circuitry. JTAG generally refers to an industry standard for verifying designs and testing printed circuitry boards after manufacture. I$^2$C generally refers to a serial protocol for a two-wire interface to connect low-speed devices like microcontrollers, I/O interfaces, and other similar peripherals in embedded systems. In some embodiments, the auxiliary I/O circuitry can couple the management unit 234 to the memory controller 200. Further, firmware for operating the management unit can be stored in the miscellaneous circuitry 242. In some embodiments, the miscellaneous circuitry 242 can be a flash memory such as flash NOR memory or other persistent flash memory device.

FIG. 3 is a functional block diagram of a management portion 334 of a memory controller in accordance with a number of embodiments of the disclosure. Glitch detectors 371-1, 371-2, . . . , 371-3 (collectively referred to herein as "glitch detectors 371") and processing units 333-1, 333-2, . . . , 333-3 (collectively referred to herein as "processing units 333").

As illustrated in FIG. 3, each processing unit (e.g., a first processing unit 333-1) can have a corresponding local glitch detector (e.g., a first glitch detector 371-1) that is physically adjacent to (most proximate to) the processing unit. In such embodiments, the first glitch detector can be designated as being "local" to the processing unit but can be designated as being "remote" to each of the other processing units (e.g., a second processing unit 333-2 and a third processing unit 333-3).

In various embodiments, the glitch detectors and processing units are coupled together in a fixed (hard-wired configuration. However, in some embodiments, the glitch detectors can be coupled together in via switches or other circuitry that permit variable interconnections between the glitch detectors and the processing units. Indications of designations of which glitch detectors are "local" or "remote" with respect to a given processing unit can be stored in a data structure such as a table or otherwise stored in the memory controller or elsewhere. Storage of indications of which glitch detectors are "local" or "remote" can promote various aspects herein such permitting notification of at least one processing unit that is "remote" to a given glitch detector. For instance, the at least one processing unit that is "remote" to the glitch detector can be notified and can subsequently transmit signaling indicative of a detected glitch to alarm circuitry 323.

A connection matrix 335 can couple the glitch detectors 371 to the processing units 331. The connection matrix 335 can couple a respective glitch detector to a plurality of processing units to permit various aspects of glitch detection redundancy such as notifying at least one "remote" processing unit of a glitch.

For instance, FIG. 4A is a functional block diagram of a management portion of a memory controller having a first configuration (a first configuration of a connection matrix including interrupt lines to permit transmission of interrupt signal) in accordance with a number of embodiments of the disclosure. As illustrated in FIG. 4A, a connection matrix can include interrupt lines which couple components together and permit transmission of interrupt signals therebetween. However, the disclosure is not so limited. Rather, in some embodiments, a connection matrix can include or be coupled to status registers to permit glitch detection to be performed via use of the status registers (e.g., by changing various bits/values) of the status registers. FIG. 4B is a functional block diagram of a management portion of a memory controller having a second configuration (a second configuration of a connection matrix utilizing latches, logical ORs, and status registers) in accordance with a number of embodiments of the disclosure. The latches, logical ORs, and/or status registers of FIG. 4B, as detailed herein, can be collectively referred to as check logic. Each respective CPU can have corresponding check logic. As detailed herein, the check logic can account for local signals (i.e., inputs) and remote signals (e.g., with respect to a given processing unit such as processing unit 433-1).

In any case, glitch detection redundancy as detailed herein provides redundant signaling (e.g., redundant interrupt signals) and/or a redundant indication (e.g., two of more status bits indicating the presence of a glitch) as a glitch confirmation signal that is propagated by a second glitch detector such as a glitch detector that is remote to the first glitch detector. Propagation of the glitch confirmation signal by the remote glitch detector can ensure that a glitch alarm is triggered, a glitch mitigation operation is performed, or both.

Each glitch detector can include an electromagnetic glitch detector, a voltage glitch detector, or both. Although, as mentioned above the use of other types of detectors is possible. As illustrated in FIG. 4A, each glitch detector of a plurality of glitch detectors 431-1, 432-1, . . . , 423-3 (collectively referred to herein as "glitch detectors 431") can include a respective voltage glitch detector and electromagnetic (EM) glitch detector.

Voltage glitch detectors 447-1, 447-2, . . . , 447-3 (collectively referred to herein as "voltage glitch detectors 447") are each coupled to a voltage source such as a power supply rail 443 (i.e., a Vcc power rail) to detect a voltage glitch via detection of a voltage change from an intended voltage. The voltage glitch detectors 447 include a digital circuit or analog circuit configured to detect a voltage glitch via detection of a voltage change from an intended voltage. In some embodiments, the voltage glitch detectors 447 include an analog circuit configured to detect a voltage glitch via detection of a voltage change from an intended voltage. In some embodiments, the voltage glitch detectors 447 include only an analog circuit (in the absence of any firmware and in the absence of any software) to detect a voltage glitch via detection of a voltage change from an intended voltage. For instance, if the analog circuit of a voltage glitch detector detects a voltage supplied from a voltage source is within a threshold range (+ and/or −) of an intended voltage (e.g., a reference voltage and/or nominal value), no glitch is detected. Conversely, if the analog circuit of the voltage glitch detector is brought out, in a specific interval time, outside a range of an intended voltage a glitch is detected. An example endpoint (e.g., a lower value of a range and/or an upper value) of a threshold range can be any value in a range from 2 megavolts (MV)/second(s) to 5 gigavolts (GV)/s, among other possible values.

EM glitch detectors 449-1, 449-2, . . . , 449-3 (collectively referred to herein as "EM glitch detectors 449") are coupled to a clock source 445 to detect an EM glitch via detection a clock signal change (e.g., a change induced by electromagnetic pulses) from an intended clock signal. The EM glitch detectors 449 include a digital circuit or analog circuit configured to detect an EM glitch via detection a clock signal change from an intended clock signal. In some embodiments, the EM glitch detectors 449 include a digital circuit configured to detect an EM glitch via detection a clock signal change from an intended clock signal. In some embodiments, the voltage glitch detectors 447 include only an digital circuit (in the absence of any firmware and in the absence of any software) to detect an EM glitch via detection a clock signal change from an intended clock signal. Examples of suitable EM glitch detectors include those described in J. Breier, S. Bhasin and W. He, "An electromagnetic fault injection sensor using Hogge phase-detector," 2017 18th International Symposium on Quality Electronic Design (ISQED), 2017, pp. 307-312, doi: 10.1109/ISQED.2017.7918333. In some embodiments, the EM glitch detectors can detect a EM glitch if a clock signal change is outside of a threshold range (+ and/or −) of an intended clock signal (e.g., an intended clock signal frequency, etc.).

As illustrated in FIG. 4A, each processing unit of the plurality of processing units 441-1, 441-2, . . . , 441-3 (collectively referred to herein as "processing units 441") has a corresponding local glitch detector. Stated differently, each respective processing unit can have an individual (single) local glitch detector. For instance, the first glitch detector 431-1 can be local to the first processing unit 433-1, the second glitch detector 431-2 can be local to the second processing unit 433-2, and the third glitch detector 431-3 can be local to the first processing unit 433-1.

Conversely, the first glitch detector 431-1 can be remote to the second processing unit 433-2 and the third processing unit 433-3, the second glitch detector 431-2 can be remote to the first processing unit 433-1 and the third processing unit 433-3, and the third glitch detector 431-3 can be remote to the first processing unit 433-1 and the second processing unit 433-2. As mentioned, embodiments herein can notify at least one processing unit which is remote to a glitch detector when the glitch detector detects an indication of a glitch. Thus, in various embodiments, each glitch detector of the glitch detectors 431 can coupled to a sub-set of the processing units 433. For instance, each glitch detector can be coupled to at least two processing units 433 such as a local processing unit and at least one remote processing unit, among other possibilities.

The connection matrix can include at least one interrupt line that couples a glitch detector to a processing unit. For example, as illustrated in FIG. 4A each processing unit 433 is coupled to a corresponding glitch detector 431 via a respective interrupt line. For instance, a first glitch detector 431-1 can be coupled via a first interrupt line 451-1 and a second interrupt line 451-2 to the first processing unit 433-1 which is local to the first glitch detector 431-1. Specifically, the first interrupt line 451-1 and the second interrupt line 451-2 can couple the first voltage glitch detector 447-1 and the first EM glitch detector 449-1, respectively, to the first processing unit 433-1, as illustrated in FIG. 4A.

In such embodiments, the first glitch detector 431-1 can be coupled, via the first interrupt line 451-1 and the second interrupt line 451-2 to the second processing unit 433-2 and the third processing unit 433-3 which are each remote to the first glitch detector 431-1. Specifically, the first interrupt line 451-1 and the second interrupt line 451-2 can couple the first voltage glitch detector 447-1 and the first EM glitch detector 449-1, respectively, to each of the second processing unit 433-2 and the third processing unit 433-3, as illustrated in FIG. 4A. In such instances, responsive to the first glitch detector 431-1 detecting an indication of a glitch, at least one of the second processing unit 433-2 and the third processing unit 433-3 can be notified, by an interrupt signal transmitted via the first interrupt line 451-1 and/or the second interrupt line 451-2, of the detected indication of the glitch.

Similarly, a third interrupt line 452-1 can couple the second voltage glitch detector 447-2 to the second processing unit 433-2 (which is local to the second voltage glitch detector 447-2) and to each of the first processing unit 433-1 and the third processing unit 433-3 (which are each remote to the second voltage glitch detector 447-2). A fourth interrupt line 452-2 can couple the second EM glitch detector 449-2 to the second processing unit 433-2 (which is local to the second EM glitch detector 449-2) and to each of the first processing unit 433-1 and the third processing unit 433-3 (which are each remote to the second EM glitch detector 449-2).

A fifth interrupt line 453-1 can couple a third voltage glitch detector 447-3 to the third processing unit 433-3 (which is local to the third voltage glitch detector 447-3) and to each of the first processing unit 433-1 and the second processing unit 433-2 (which are each remote to the third voltage glitch detector 447-3). A sixth interrupt line 453-2 can couple the third EM glitch detector 449-3 to the third processing unit 433-3 (which is local to the third EM glitch detector 449-3) and to each of the first processing unit 433-1 and the second processing unit 433-2 (which are each remote to the third EM glitch detector 449-3).

While describe above with respect to a given quantity of glitch detectors and a given quantity of processing units, the quantity of glitch detectors and/or quantity of processing units can be varied. Further, while described above with respect to detection of a glitch by the first glitch detector 431-1, it is understood that any one or more of the glitch detectors 431 can detect a glitch and can notify any of processing units 433. Moreover, while the glitch detectors are described in FIG. 4A as including a given quantity of interrupt lines coupling the glitch detectors to the processing units that quantity of interrupt lines can be increased or decreased.

FIG. 4B is similar to FIG. 4A, except that the connection matrix includes a status register and related circuitry such as latches in place of at least some of the interrupt lines of FIG. 4A. That is, in some embodiments each glitch detector of the glitch detectors 431 can an associated status register (e.g., such as an overall status register 470). In this way, a default status of each glitch detector can be represented, for instance, by "0" when an indication of glitch is not detected and can be changed to "1" responsive to detection of an indication of a attack. Thus, a given processing unit, another component in the memory controller, and/or a host can poll a latch/status register such as the overall status register and thereby readily determine whether or not an indication of a glitch has been detected by any of the glitch detectors.

As illustrated in FIG. 4B, a processing unit such as the first processing unit 433-1 can be coupled to or include an overall status register 470. The overall status register can be coupled to or included in each glitch detector of a plurality of glitch detectors (e.g., coupled to each glitch detector 371-1, 371-2, ..., 371-3, as illustrated in FIG. 3) and can receive signals (i.e., inputs) from the plurality of glitch detectors. For instance, a signal 461-1 and a signal 461-2 can be received from glitch detectors which are local to the first processing unit 433-1 (i.e., local glitch detectors). Specifically, the signal 461-1 can be received from a local voltage glitch detectors such as the first voltage glitch detector 447-1 and the signal 461-2 can be received from a local EM glitch detector such as the first EM glitch detector 449-1.

The signals 461-1, 461-2 can be communicated to a status register to cause a corresponding value of a status bit to be changed or remain unchanged. For instance, the signal 461-1 can cause a status bit to remain unchanged (e.g., remain as "0") in the absence of detection of an indication of a glitch or can cause the status bit to change (e.g., change to "1") responsive to detection of an indication of a glitch. The signal 461-1 can cause a change in a bit of a first voltage latch 465-1, a change in a bit in an overall status register 470, or both. For instance, the signal 461-1 can cause a change in a bit of the first voltage latch 465-1 and also can cause a change in the bit in the overall status register 470. Similarly, the signal 461-2 can cause a change in a bit of a first EM latch 466-1, a change in a bit (representative of the bit of the first voltage latch 465-1) in the overall status register 470, or both. For instance, the signal 461-2 can cause a change in a bit of the first EM latch 466-1 and also can cause a change in the bit (representative of the bit of the first EM latch 466-1) in the overall status register 470.

Additionally, the overall status register 470 can be coupled to each of a plurality of remote glitch detectors to receive respective signals 463-N, 464-N from the plurality of remote glitch detectors. The signal 463-N can cause a change in a bit in a respective voltage latch (e.g., a second voltage latch 465-2 and/or a third voltage latch 465-(N), a change in a respective bit in the overall status register 470, or both. Similarly, the signal 464-N can cause a change in a bit in a respective voltage latch (e.g., a second EM latch 466-2 and/or a third EM latch 466-(N), a change in a respective bit in the overall status register 470, or both.

An operation can be performed by a processing unit or another component to determine a bit value in a latch and/or the overall status register 470. For instance, a logical OR operation as represented at 468 and 469 can be performed via an interrupt line such as first interrupt (IRQ) line 454-1 and/or a second interrupt line 454-2. For example, the operation can determine a bit value (e.g., determine if any of the bits are set to "1" representing that a glitch detector has detected an indication of a glitch) in the overall status register 470. While illustrated as including a total of two interrupt lines 454-1, 454-2 in some instances fewer interrupt lines such as an individual interrupt line can be employed. In any case, a given processing unit, another component in the memory controller, and/or a host can poll the overall status register 470 and thereby readily determine whether or not an indication of a glitch has been detected by any of the glitch detectors, in some embodiments.

Figure 5:
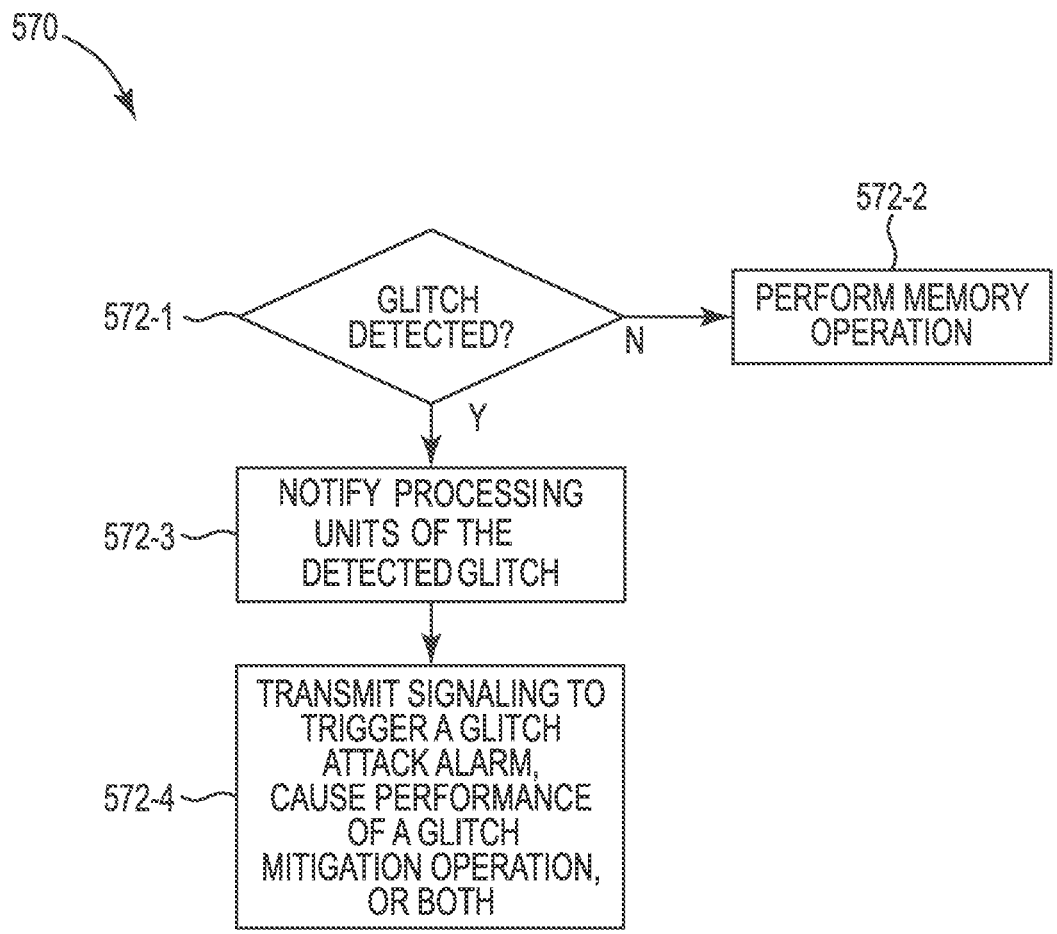
FIG. 5 is a functional flow diagram of a number of embodiments of the disclosure.

FIG. 5 is a functional flow diagram 570 of a number of embodiments of the disclosure. At 572-1 a glitch can be detected. For instance, an indication of the glitch such as a glitch in a clock signal, a glitch in a voltage (e.g., a voltage supplied to a memory system and/or a component included in the memory system), or both, among other possible indications of an occurrence of a glitch such as a glitch from a glitch attack can be detected.

In the absence of detection of an indication of a glitch the functional flow diagram 570 can proceed to 572-2. At 572-2 a memory system can operate normally in the absence of the glitch. For example, the memory system can perform various memory operations (e.g., read operations, write operations, etc.), among other possible normal memory operations performed in the absence of the glitch. For instance, a signal indicative of the data can be transmitted to a cache and/or transmitted to memory devices. In this way, the host can perform a memory operation (e.g., a memory access request) associated with a cache and/or a memory die.

However, responsive to detection of an indication of a glitch the functional flow diagram 570 can proceed to 572-3. At 572-3, a plurality of processing units can be notified of the detected indication of the glitch, as detailed herein. For instance, in some embodiments each processing unit of the plurality of processing units can be notified of the detected indication of the glitch, among other possibilities.

Responsive to notification of the plurality of processing units the functional flow diagram 570 can proceed to 572-4. At 572-4, signaling can be transmitted to trigger a glitch alarm, cause performance of a glitch mitigation operation, or both.

As mentioned, a glitch alarm can be triggered by alarm circuitry (e.g., the alarm circuitry 323 as illustrated in FIG. 3). Causing performance of a glitch mitigation operation can include issuing a command. For instance, a command can be issued to a host, to a portion of a memory controller, and/or to a memory device. Examples of commands to mitigate a glitch include commands associated with performing a refresh operation such as those that refresh row address, altering a refresh mode/timing, returning "bad"/"poison" data to a host, causing an interrupt such as an interrupt at a host, and/or providing a notification such as notification provided to a controller, among other possibilities. In any case, performance of the glitch mitigation operation can mitigate any impact (e.g., charge leakage, data corruption, power consumption, computation burden, etc.) associated with an occurrence of a glitch.

Figure 6:
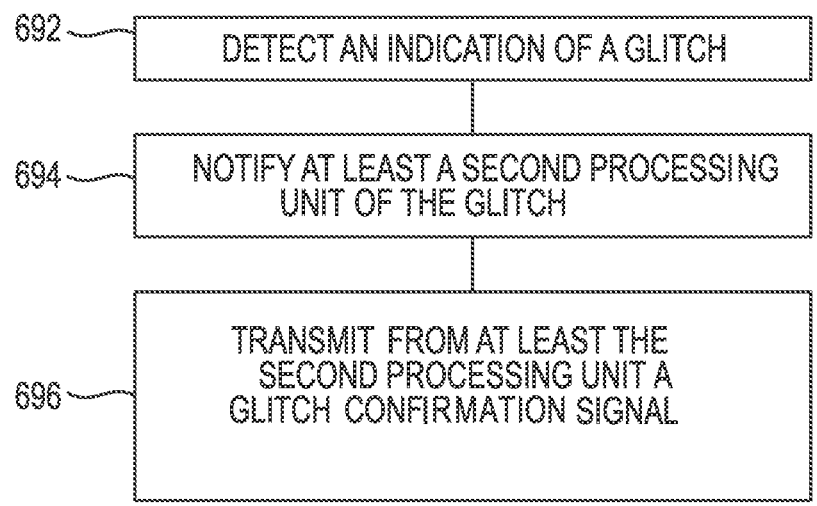
FIG. 6 is a flow diagram of a method for glitch detection redundancy in accordance with a number of embodiments of the disclosure.

FIG. 6 is a flow diagram of a method for glitch detection in accordance with a number of embodiments of the disclosure. The methods described herein (e.g., with respect to FIG. 6) can be performed by processing logic that can include hardware (e.g., processing device, circuitry, dedicated logic, programmable logic, microcode, hardware of a unit, integrated circuit, etc.), software (e.g., instructions run or executed on a processing unit), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 692 the method can include detecting, by a local glitch detector, an indication of a glitch on a memory system. For instance, the method can include detecting, by a local glitch detector coupled via a connection matrix to a first processing unit included in a plurality of processing units, an indication of a glitch on a memory system. Detecting the indication of the glitch can occur in various manners such as detecting a glitch in a clock signal, a glitch in a voltage (e.g., a voltage supplied to a memory system and/or a component included in the memory system), or both, among other possibilities. The glitch in the clock signal or glitch in the voltage can refer to a deviation from an intended clock signal or intended voltage, respectively. For instance, a glitch can cause a deviation in clock frequency, a deviation in value of a clock signal voltage, or both, among other possible deviations associated with the clock signal. Similarly, a glitch can cause a deviation in a value of a voltage such as a supply voltage signal, a programming voltage, and/or a reference voltage, among other possible voltages associated with a memory system. The glitch attack can, in some instances, target a CPU sub-system, such as those described herein. For instance, the glitch attack can seek to subvert a security check (e.g., such that a security check employing a cryptographic key and/or other type of key is not performed/not performed as intended).

In some embodiments, a determination can be made as to whether a clock signal and/or a given voltage has deviated from an operational threshold. The determination can be made at a controller of the memory system. Responsive to a determination that the clock signal and/or supply voltage signal is greater than a threshold magnitude away from an intended (normal operational) clock signal and/or supply voltage signal, a glitch detector can transmit a signal such as transmission of a signal to a processing unit. In this way, the glitch detector can detect the deviation that is at least a threshold difference away from an intended clock signal and/or intended voltage thereby being indicative of occurrence of the glitch.

At 694 at least a second processing unit (at least one remote processing unit) can be notified of the detected indication of the glitch. Such notification can occur via the connection matrix, as detailed herein. For instance, at least the second processing unit can be notified by transmitting an interrupt signal to the second processing unit. For example, an interrupt signal can be sent from a first glitch detectors, a first processing unit, or both, via an interrupt line included in the connection matrix to the second processing unit to notify the second processing unit of the detected indication of the glitch. Use of an interrupt signal can be desired to ensure direct and timely notification of at least the second processing unit of the detected indication of a glitch.

However, as mentioned, the disclosure is not so limited and in some embodiments can utilize check logic (e.g., latches, logical ORs, and status registers) to provide notification of a detected indication of a glitch. Rather, in some instances, a signal can be transmitted to alter a value of a bit in a status register and thereby provide basis for notification at least the second processing unit of the detected indication of the glitch. For example, in some embodiments notifying at least the second processing unit can include transmitting signaling to alter the status register associated with a first processing unit from a first status bit value (e.g., "0") to a second status bit value (e.g., "1") responsive to detecting the indication of the glitch, and subsequent to transmitting the signaling to alter the status of the status register, transmitting signaling to poll a current status of the status register. Thus, the polling of the status register can return the second status bit value (e.g., "1") and thereby indicate to other components such as a memory controller and/or a host that an indicator of a glitch has been detected. For instance, a corresponding flag bit can be changed (e.g., changed from "0" to "1") responsive to the status bit value being changed to the second status bit value (e.g., "1") and thus any subsequent polling can readily detect the presence of the flag bit having a value of "1" rather than another value such as a default value of "0").

In some embodiments, each glitch detectors can have an associated status register and/or an associated status register bit. For instance, a status register (e.g., an overall status register such as the overall status register 470, as illustrated in FIG. 4) can include included in each glitch detector. The status register can include a plurality of bits indicative of a respective status of a local glitch detector (local to the processing unit and check logic of the processing unit) and at least one remote glitch detector in the memory system. A status register can include a plurality of bits corresponding to a plurality of potential statuses of a given glitch detector depending on whether or not a glitch has been detected by a glitch detector. For instance, the embodiment described in FIG. 4B, a status register could include a first bit "0" corresponding to a voltage glitch detector such as the voltage glitch detector 447-1 having a "0" status when a glitch is not detected, a second bit "1" corresponding a EM glitch detector such as the EM glitch detector 449-1 having a "0" status when an EM glitch attack is not detected, a third bit "2" corresponding to the voltage glitch detector having a "1" status when a glitch is detected, and a fourth bit "3" corresponding the EM glitch detector having a "1" status when an EM glitch attack is detected, among other possibilities. As an example, the third and fourth bits can be associated, respectively, to voltage glitch detector 447-2 and EM detector 449-2 of FIG. 4A.

While described above for two glitch detectors (the voltage glitch detector 447-1 and the EM glitch detector 449-1) the quantity of voltage and/or EM glitch detectors can be varied (increased or decreased) and the corresponding quantity of bits can be varied accordingly (e.g., increased a corresponding quantity to account for an increase in a quantity of glitch detectors). For instance, in some embodiments a plurality of bits can be included in a status register that are indicative of a respective status of each remote glitch detector in the memory system. In this way, a given status register can provide a respective status of each remote glitch detector along with a local glitch detector. Thus, the memory system can poll and readily determine a respective status of each glitch detector by virtue of polling an individual status register without having to poll each respective glitch detector and/or a dedicated status register associated with the respective glitch detector.

Moreover, while it is described above such that each respective glitch detectors can have two statuses (e.g., a first status when glitch detected and a second status when a glitch not detected) the quantity of statuses can be varied. For instance, in some embodiments an additional status and corresponding register value can be utilized to indicate an operational status of the glitch detector (e.g., a first status when the glitch detector is operational and a second status when the glitch detector is off-line), among other possibilities.

In some embodiments, notifying at least the second processing unit can further include notifying the first processing unit of the detected indication of the glitch. For instance, in some embodiments, notifying the second processing unit and the first processing unit of the indication of the glitch can occur by transmitting, via the connection matrix, a first interrupt signal from the local glitch detector to the first processing unit and transmitting, via the connection matrix, a second interrupt signal from the local glitch detector to the second processing unit. In such instances, the second processing unit can consider the second interrupt signal from the local glitch detector as being generated by a remote detector (that is remote to the second processing unit).

In some embodiments, transmitting the first interrupt signal can occur substantially contemporaneously with transmitting the second interrupt signal. Transmitting the transmitting the first interrupt signal substantially contemporaneously with transmitting the second interrupt signal can provide timely and effective notification of a plurality of processing units of detection of an indication of a glitch. As used herein, the term "substantially" means that the characteristic need not be absolute, but is close enough so as to achieve the advantages of the characteristic. For example, "substantially contemporaneously" is not limited to operations that are performed absolutely contemporaneously and can include timings that are intended to be contemporaneous but due to manufacturing limitations and may not be precisely contemporaneously. For example, due to signal delays that may be exhibited by various interfaces (e.g., LPDDR5 vs. PCIe), signals that are employed "substantially contemporaneously" may not start or finish at exactly the same time.

However, in some embodiments at least one of the processing units can be notified prior to notification of another processing unit. For instance, a first processing unit which is coupled to a local glitch detector can be notified prior to a second processing unit which is remote from the local glitch detector. Notifying the first processing unit prior to the second processing unit can occur at least in part due to a physical proximity of the first processing unit to the local glitch detector and/or can permit rapid transmission of signaling via the first processing unit to trigger a glitch alarm, cause performance of a glitch mitigation operation, or both. Such transmissions can occur prior to any subsequent transmission (e.g., from the second processing unit) to trigger a glitch alarm, cause performance of a glitch mitigation operation, or both, in the event that first processing unit does not successfully transmit the signaling to trigger a glitch alarm and/or cause performance of a glitch mitigation operation.

At 696, a glitch confirmation signal can be transmitted. The glitch confirmation signal can be transmitted to trigger a glitch alarm, cause performance of a glitch mitigation operation, or both. For instance, a glitch confirmation signal can be transmitted from at least a second processing unit to trigger a glitch alarm, cause performance of a glitch mitigation operation, or both. That is, at least one processing unit (e.g., the second processing unit) that is remote to the local glitch attack detector can transmit a signal to trigger a glitch alarm, cause performance of a glitch mitigation operation, or both. In this way, even if the first processing unit is impacted by the glitch, the signal to trigger the trigger a glitch alarm, cause performance of a glitch mitigation operation, or both, is still transmitted to other components in the memory system to ensure an alarm is triggered and/or a mitigation measure is employed to mitigate the glitch.

For instance, in some embodiments each processing unit of the plurality of processing units can be notified of the detected indication of the glitch. In such instances, some or all of the plurality of processing units can transmit a signal to trigger a glitch alarm, cause performance of a glitch mitigation operation, or both. Notifying each processing unit of the plurality of processing units of the detected indication of the glitch can provide the greatest degree of redundancy and thus the highest likelihood that at least one of the processing units will successfully trigger a glitch alarm, cause performance of a glitch mitigation operation, or both, prior to any impact from the actual glitch such as a glitch from an actual glitch attack that may serve to render the processing unit(s) unable to trigger a glitch alarm, cause performance of a glitch mitigation operation, or both. For instance, in some embodiments, each processing unit included in the plurality of processing units can be notified substantially concurrently, as detailed herein.

In some embodiments a mitigation action can include issuance of notification and/or issuance of a command such as a refresh command. For instance, a notification can be issued to a host and/or a refresh command can be issued to some or all row addresses. However, other mitigation mechanisms such as those detailed herein are possible.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the disclosure includes other applications in which the above structures and processes are used. Therefore, the scope of one or more embodiments of the disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method comprising:
    providing a plurality of glitch attack detectors included in a memory system and a connection matrix that couples each individual glitch attack detector of the plurality of glitch attack detectors to at least two processing units;
    detecting, by one of the plurality of glitch attack detectors coupled via the connection matrix to a first processing unit of a plurality of processing units, an indication of a glitch attack on the memory system;
    notifying, via the connection matrix, at least a second processing unit of the plurality of processing units of the detected indication of the glitch attack; and
    subsequent to notifying the at least second processing unit, transmitting, via the at least second processing unit, a glitch attack confirmation signal.

2. The method of claim 1, wherein detecting the indication of the glitch attack further comprising detecting a glitch attack in a clock signal, a glitch attack in a supply voltage signal, or both.

3. The method of claim 1, wherein notifying at least the second processing unit further comprises transmitting an interrupt signal at least to the second processing unit.

4. The method of claim 1, wherein notifying at least the second processing unit further comprises:
    transmitting signaling to alter a status of a status register associated with the first processing unit from a first status to a second status responsive to detecting the indication of the glitch attack; and
    subsequent to transmitting the signaling to alter the status of the status register, transmitting signaling to poll a current status of the status register.

5. The method of claim 1, further comprising notifying, via the connection matrix, the first processing unit of the detected indication of the glitch attack.

6. The method of claim 5, further comprising notifying the at least second processing unit and the first processing unit of the indication of the glitch attack by:
    transmitting, via the connection matrix, a first interrupt signal from the glitch attack detector to the first processing unit; and
    transmitting, via the connection matrix, a second interrupt signal from the glitch attack detector to the at least second processing unit.

7. The method of claim 6, further comprising transmitting the first interrupt signal substantially contemporaneously with transmitting the second interrupt signal.

8. The method of claim 1, further comprising notifying each processing unit of the plurality of processing units of the detected indication of the glitch attack.

9. The method of claim 8, further comprising substantially concurrently notifying each processing unit of the plurality of the processing units of the detected indication of the glitch attack.

10. An apparatus comprising:
    a plurality of processing units;
    a plurality of glitch attack detectors that are configured to detect an indication of a glitch attack on the apparatus; and
    a connection matrix to couple each of the plurality of glitch attack detectors to at least two of the plurality of processing units.

11. The apparatus of claim 10, wherein the plurality of processing units include a first processing unit, and the plurality of glitch attack detectors include a local glitch attack detector that is a most proximate of the plurality of processing units to the first processing unit.

12. The apparatus of claim 11, wherein each glitch attack detector of the plurality of glitch attack detectors includes an electromagnetic (EM) glitch attack detector, a voltage glitch attack detector, or both.

13. The apparatus of claim 11, wherein each processing of the plurality of processing units has a corresponding local glitch attack detector.

14. The apparatus of claim 13, wherein each glitch attack detector is coupled to a sub-set of the plurality of processing units.

15. The apparatus of claim 14, wherein each glitch attack detector is coupled via a plurality of respective interrupt lines to the sub-set of the plurality of processing units.

16. The apparatus of claim 15, wherein each processing unit has an associated status register storing a plurality of bits indicative of a respective status of a local glitch attack detector and at least one remote glitch attack detector, and wherein each bit of the plurality of bits is indicative of a respective status of each glitch attack detector.

17. The apparatus of claim 12, wherein:
the voltage glitch attack detector includes an analog circuit configured to detect a voltage glitch attack via detection of a voltage change from an intended voltage, and
the EM glitch attack detector includes a digital circuit configured to detect an EM glitch attack via detection a clock signal change from an intended clock signal.

18. An apparatus comprising:
a plurality of processing units;
a plurality of glitch detectors;
a connection matrix to couple each of the plurality of glitch detectors to at least two of the plurality of processing units; and
alarm circuitry coupled to the plurality of processing units configured to:
receive from at least one processing unit of the plurality of processing units signaling indicative of a detected glitch attack; and
responsive to receipt of the signaling indicative of the detected glitch attack, trigger a glitch attack alarm, transmit signaling to cause performance of a glitch attack mitigation operation, or both.

19. The apparatus of claim 18, wherein the alarm circuitry is further configured to transmit a system-wide glitch attack alarm to a plurality of components of a memory device.

20. The apparatus of claim 18, further comprising a memory controller configured to operate in accordance with a non-deterministic memory protocol.

* * * * *